US011967935B2

United States Patent
Ayranci et al.

(10) Patent No.: US 11,967,935 B2
(45) Date of Patent: Apr. 23, 2024

(54) CONFIGURABLE PHASE TUNED MULTI-GAIN LNA ARCHITECTURE

(71) Applicant: pSemi Corporation, San Diego, CA (US)

(72) Inventors: Emre Ayranci, Costa Mesa, CA (US); Phanindra Yerramilli, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 307 days.

(21) Appl. No.: 17/240,852

(22) Filed: Apr. 26, 2021

(65) Prior Publication Data
US 2022/0345089 A1    Oct. 27, 2022

(51) Int. Cl.
*H03F 1/26* (2006.01)
*H03F 1/22* (2006.01)
*H03F 3/195* (2006.01)
*H03G 3/34* (2006.01)

(52) U.S. Cl.
CPC .............. *H03F 1/26* (2013.01); *H03F 1/223* (2013.01); *H03F 3/195* (2013.01); *H03F 2200/294* (2013.01); *H03F 2200/372* (2013.01); *H03F 2200/451* (2013.01); *H03G 3/344* (2013.01)

(58) Field of Classification Search
CPC ............ H03F 1/26; H03F 1/223; H03F 3/195
USPC ....................................................... 330/253
See application file for complete search history.

(56) References Cited

U.S. PATENT DOCUMENTS

| 7,696,841 B2 * | 4/2010 | Chen ........................ H03F 1/56 333/128 |
|---|---|---|
| 10,700,650 B1 | 6/2020 | Ayranci et al. |
| 2008/0284522 A1 | 11/2008 | Denoyer |
| 2010/0237947 A1 | 9/2010 | Xiong et al. |
| 2011/0298545 A1 * | 12/2011 | Morimoto ............... H03F 3/195 330/296 |
| 2012/0105147 A1 * | 5/2012 | Harris ...................... H03F 1/56 330/57 |
| 2016/0181985 A1 | 6/2016 | Aoki |
| 2019/0020322 A1 | 1/2019 | Ayranci et al. |
| 2020/0099344 A1 * | 3/2020 | Maalouf ................. H03F 1/301 |
| 2020/0106394 A1 * | 4/2020 | Thoppay Egambaram ................. H03F 3/195 |
| 2020/0266786 A1 | 8/2020 | Kovac et al. |
| 2022/0021363 A1 * | 1/2022 | Cui ......................... H03F 3/193 |
| 2022/0247364 A1 * | 8/2022 | Padyana .................. H04B 1/16 |

OTHER PUBLICATIONS

International Search Report and Written Opinion for International Application No. PCT/US2022/025413 filed on Apr. 19, 2022 on behalf of pSEMI Corporation dated Aug. 9, 2022 7 pages.

* cited by examiner

*Primary Examiner* — Patricia T Nguyen
(74) *Attorney, Agent, or Firm* — Steinfl + Bruno LLP (57) ABSTRACT

Methods and systems for a multi gain LNA architecture achieving minimum phase discontinuity between all the different active and passive gain modes that uses different LNA configurations and settings for single and multi-stage LNAs by a configurable combined output matching and phase adjusting circuitry.

22 Claims, 11 Drawing Sheets

CONFIGURABLE PHASE TUNED MULTI-GAIN LNA ARCHITECTURE

BACKGROUND

(1) Technical Field

The disclosure relates to phase matching between output paths or between gain modes. Specifically, it relates to matching the phase between gain paths of low noise amplifiers (LNAs), including two-stage LNAs.

(2) Background

As a signal goes through a device, such as a low-noise amplifier, the elements of the device can impose a phase shift from the input signal. For devices with different paths (e.g. different gain paths, such as high gain wideband paths vs. low current power saving paths) for the signal to traverse in different operation modes, these phase shifts can be different from each other. For example, in a low noise amplifier, there may be different selectable paths for different gains, including a bypass path for low gain. Some applications require that switching between these modes apply a minimal phase shift.

Figure 1A:
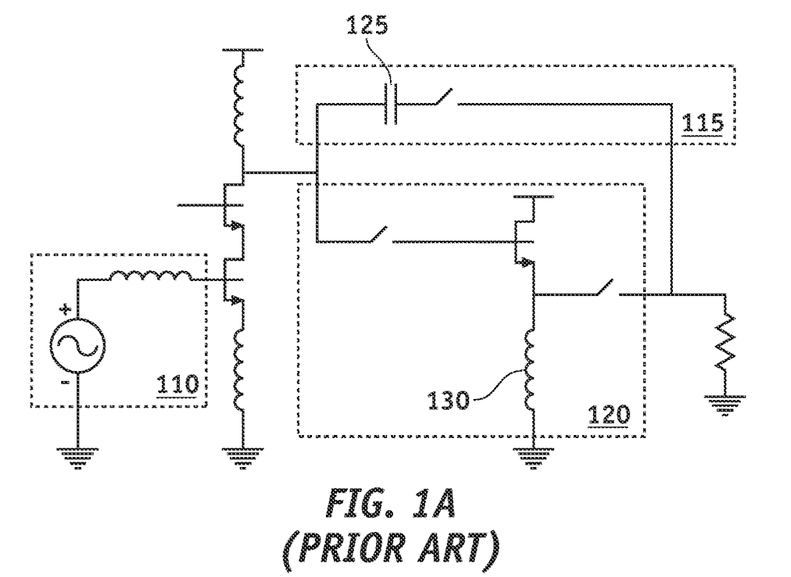
FIG. 1A shows an example circuit design.

FIG. 1A shows an example of a device with an input signal generator (110) going through either a high gain path (120) or a low gain path (115), depending on the positions of the various switches in the circuit. The high gain path (120) is wideband and uses source follower for high gain. The low gain uses narrowband low noise amplifier topology to provide lower gain at lower current usage (e.g. power saving mode). The low gain path can be, for example, a bypass path, or it can be a path for a lower gain mode. It is noted that the high gain path (120) includes a passive element (130), in this case an inductor, and the low gain path (115) also includes a passive element (125), in this case a capacitor. These provide output impedance matching.

Figure 1B:
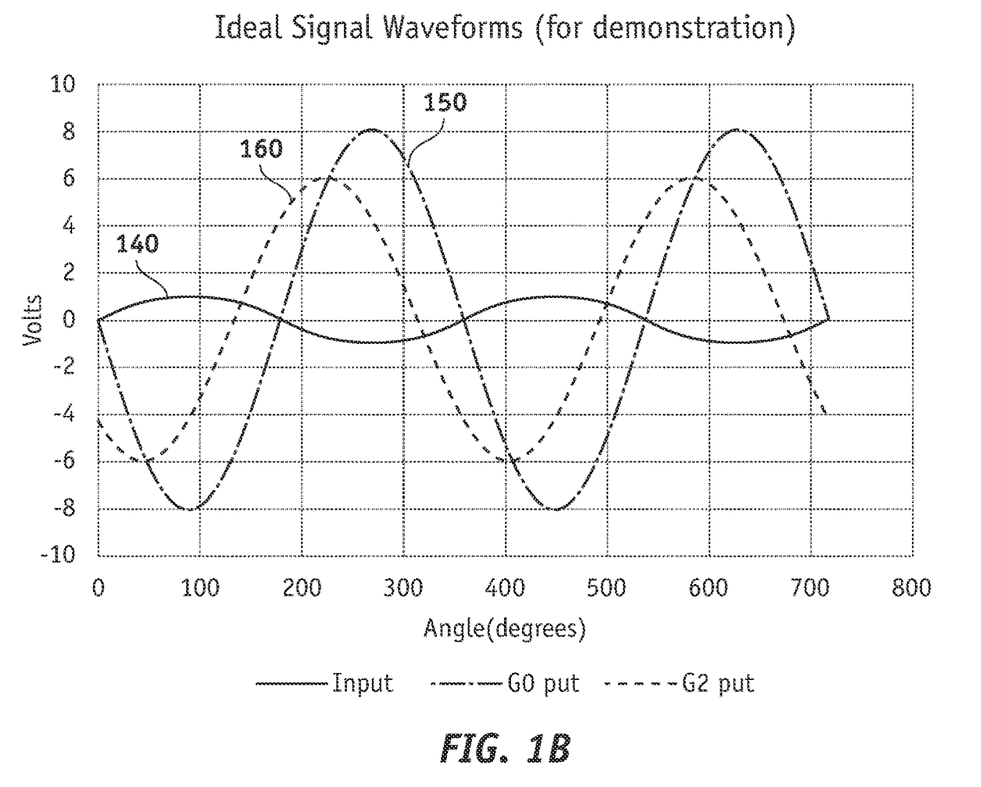
FIG. 1B shows a demonstrative comparison of ideal signal waveforms of such a circuit.

FIG. 1B shows an example chart of comparing the input signal (140) with a high gain path signal (150), designated here as "G0", and a low gain path signal (160), designated here as "G2" (signal amplitudes are arbitrary in the Figure and are exaggerated for better visualization of the phases—an actual bypass would have nearly no gain or even a loss with respect to the input). While both output signals (150, 160) have a phase shift with respect to the input (140), what is really of concern is the phase shift between the high gain signal (150) and the low gain signal (160), which might need to be minimized for the circuit's intended purpose.

Figure 2:
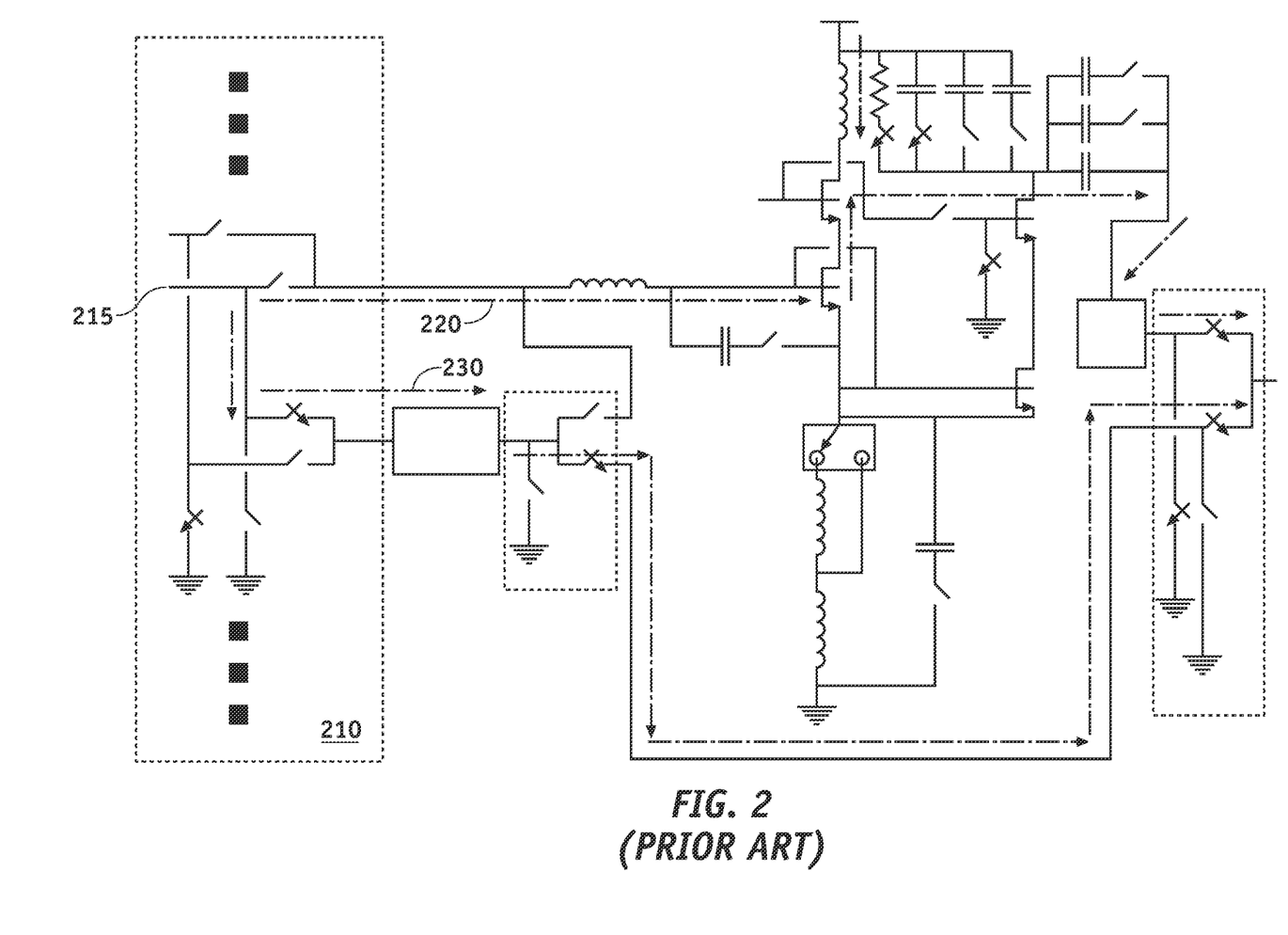
FIG. 2 is an example of simplified schematic of a low noise amplifier with an active bypass path and a passive bypass path.

FIG. 2 shows the active bypass (220) and passive bypass (230) of a low noise amplifier, from an input (215) from the inputs (210). If the passive bypass (230) can be phase shifted to be close to gain paths (or if the gain paths can be shifted to be close to the bypass), then the active bypass (220) can be removed from the design, freeing up valuable chip space and improve performance in high gain mode which is more critical.

SUMMARY

The systems and methods presented herein provide for phase matching different output paths of a circuit in a way that minimizes the number of added components to the circuit. Specifically, it utilizes existing components of a given path, for example components used for output impedance matching, in the phase matching elements added to that path.

According to a first aspect of the present disclosure, a device is described comprising: a first gain path with a first gain and a first circuit component; a second gain path with a second gain different than the first gain and a second circuit component separate from the first circuit component; a phase shift sub-circuit on the second gain path wherein the phase shift sub-circuit includes the second circuit component and the second circuit component performs output matching for the device on the second gain path. In various embodiments the first gain path comprises a first low noise amplifier with a first active device, or the second gain path comprises a second low noise amplifier with a second one active device, or the first gain path comprises the first low noise amplifier with the first active device and the second gain path comprises the second low noise amplifier with the second one active device.

According to a second aspect of the present disclosure, a method for adding a phase matching sub-circuit to a circuit with multiple gain paths is described, the method comprising: selecting a gain path of the multiple gain paths; determining a phase shift to match a phase of the gain path to phases of other gain paths of the multiple gain paths; determining a circuit component on the gain path to include in the phase matching sub-circuit; selecting a topology of the phase matching sub-circuit based on the phase shift and the circuit component; including the phase matching sub-circuit to the circuit.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIGS. 1A and 1B shows an example of a device with two gain paths.

FIGS. 3A-3C are examples of device schematics with a phase shift element added to a path, utilizing existing components.

FIGS. 4A-4D show examples of phase shift elements that can utilize existing circuit components.

FIGS. 5A-5C shows example graphs for a phase shift compensated amplifier.

FIGS. 6A-6D show examples of applications of phase shift sub-circuits in a low noise amplifier with a passive bypass.

Like reference numbers and designations in the various drawings indicate like elements.

DETAILED DESCRIPTION

An improved group of systems and methods is presented that minimizes phase discontinuity between different gain modes (including bypass modes) with minimal increase in circuit size (footprint or number of components) and complexity. This is particularly useful for low noise amplifier design but can also be applied to other devices.

As used herein, "phase matching" refers to minimizing or effectively reducing the phase difference between two or more signals. As used herein, "phase shift" refers to adjusting the phase of a signal to be temporally either ahead or behind the signal's previous phase. Changing the phase to be later in time can be referred to as increasing the phase or making a positive phase shift. Changing the phase to be earlier in time can be referred to as decreasing the phase or making a negative phase shift.

As used herein, "gain mode" is a mode of the circuit that provides a specific gain level (usually as a function of frequency) relative to other gain modes.

As used herein, "gain path" refers to a circuit path to an output that has a gain or loss relative to other outputs. As used herein, "bypass path" is a gain path that has a lower gain than most other gain paths and lower gain than any other non-bypass gain paths. A single given gain path can have multiple gain modes depending on what elements in the path are connected (via switches) during use. Gain paths can include transistor amplifiers such as one stage amplifiers (e.g. for low gain paths) and two stage amplifiers (e.g. for high gain paths).

As used in the present disclosure, the term "sub-circuit" refers to a circuit/network of elements that are used as part of a larger circuit/network/device.

Figure 3A:
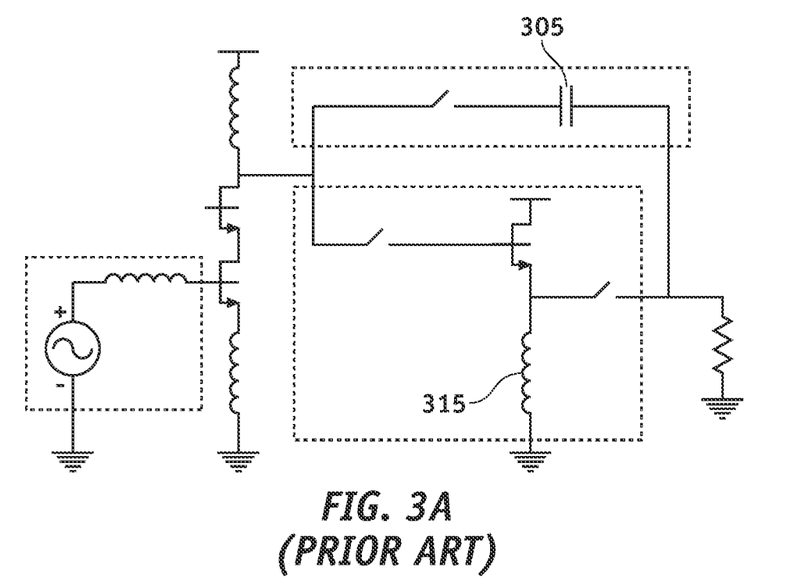
FIG. 3A shows an example amplifier circuit without phase shift.

FIG. 3A shows a circuit prior to adding the phase shift elements. The low gain path includes a capacitor (305) that can be utilized for a phase shift element (see FIG. 3B). Likewise, the high gain path includes an inductor (315) that can be utilized for a phase shift element (see FIG. 3C).

Figure 3B:
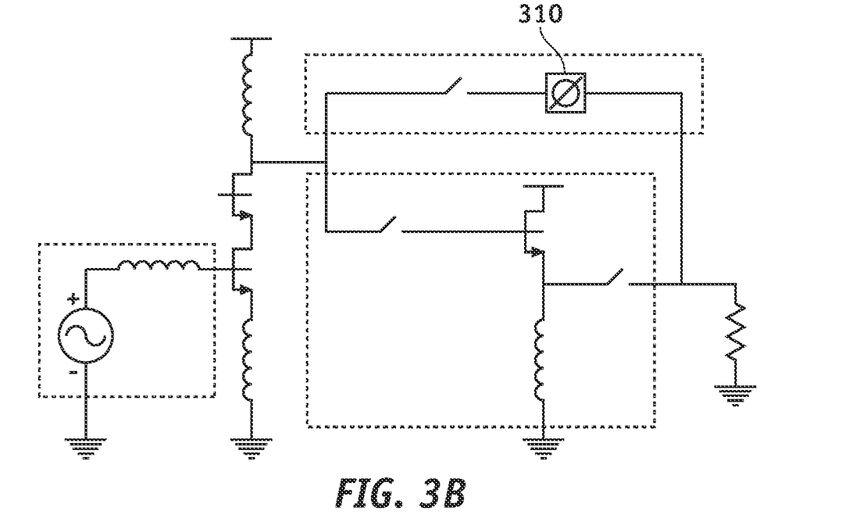
FIG. 3B shows an example where the phase shift is in a low gain path and FIG. 3C shows an example where the phase shift is in a high gain path.
Figure 3C:
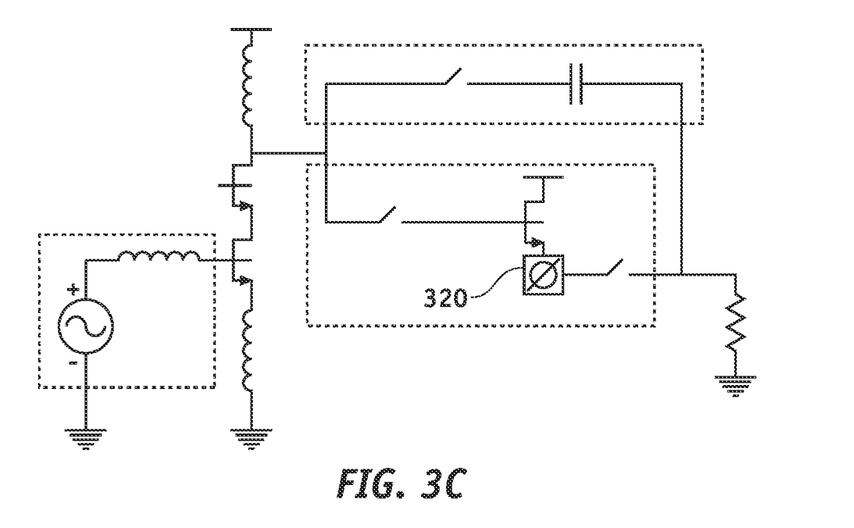

FIG. 3B shows an implementation of including a phase shift element in accordance with the present disclosure. A phase shift sub-circuit (310) is included in the low gain path of an amplifier circuit. It utilizes the existing capacitor (305 of FIG. 3A) in the path to form the circuit, thereby functioning as both a phase shift element and an output matching element. FIG. 3C shows another implementation where the phase shift sub-circuit (320) is in the high gain path, utilizing an already existing inductor (315 of FIG. 3A) that was used for output matching. In some embodiments the low gain path phase shifter shifts back (negative) to the high gain phase or the high gain path phase shifter shift forward (positive) to the low gain phase (see FIG. 1B).

These phase shift sub-circuits (310, 320) can be placed anywhere in their respective paths where a circuit element (e.g. capacitor or inductor) is already located (e.g. as an output matching element). There can be one phase shift element, or multiple, so long as the cumulative effect is that the paths (gain and bypass) are all phase matched. These sub-circuits can take many forms, depending on the requirements of the sub-circuit at that location (phase shift direction, high-pass vs. low pass, number and type of existing elements used, etc.)

In some embodiments, the highest gain mode is used as the reference phase and other gain modes are phases shifted to match the highest gain mode. This prevents loss in the highest gain mode due to any addition of elements (e.g. the phase shifter). In some embodiments, a different reference is used, for examples another gain mode (whereby that gain mode would not be phase shifted) or an external reference phase (whereby all gain modes are phase shifted).

Figure 4A:
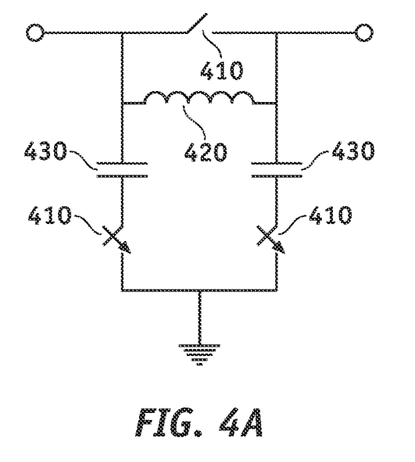
FIG. 4A shows an example of a low pass PI filter with a negative phase shift.
Figure 4B:
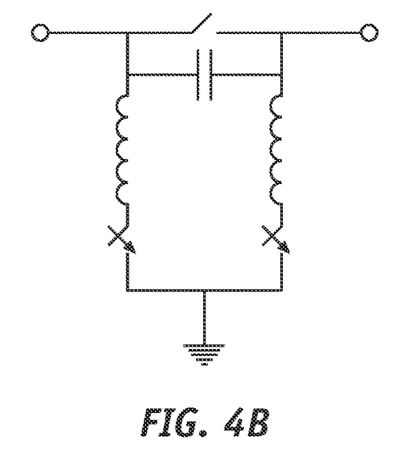
FIG. 4B shows an example of a high pass PI filter with a positive phase shift.
Figure 4C:
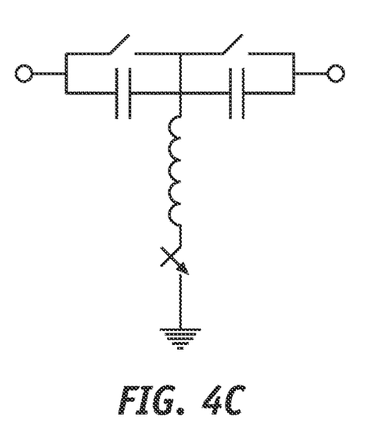
FIG. 4C shows an example of a high pass TEE filter with a positive phase shift.
Figure 4D:
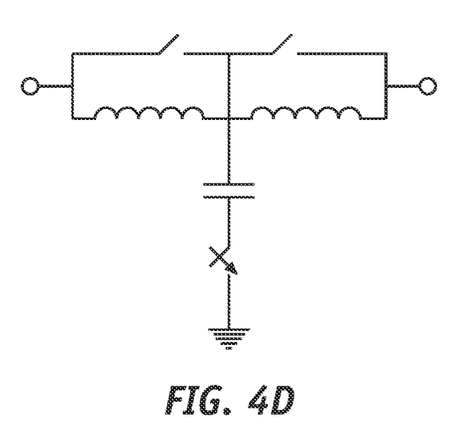
FIG. 4D shows an example of a low pass TEE filter with a negative phase shift.

Examples of simple sub-circuit topologies are shown in FIGS. 4A-4D. FIG. 4A shows an example low pass PI sub-circuit with a negative phase shift, with one inductor in series and two capacitors in parallel (with respect to the input and output). FIG. 4B shows an example high-pass PI sub-circuit with a capacitor in series and two inductors in parallel. FIG. 4C shows an example high-pass TEE sub-circuit with two capacitors in series and one inductor in parallel. FIG. 4D shows and example low pass TEE sub-circuit with two inductors in series and one capacitor in parallel. For example, if the selected path requires a negative phase shift and has a single inductor already in place, then the low-pass PI sub-circuit can be used to utilize the existing inductor and provide the required phase shift. Note that these example sub-circuits include switches to control (insert or remove) the phase shift, as well as selecting which elements of the sub-circuit are active. For example, in FIG. 4A the switches (410) can be used to engage the inductor (420), but not the capacitors (430). These switches can be implemented a number of ways, including as integrated field-effect transistor (FET) switches (or a stack of FET switches, for example for high voltage applications) Components can be switched on (active) and off as needed for different gain modes and/or different frequency bands of operation. See, e.g., FIGS. 6C and 6D for different gain modes. These sub-circuits can be more complicated than shown in the examples. For example, multiple sub-circuits can be cascaded to amplify the phase shift or put in parallel blocks to increase the bandwidth.

Figure 5A:
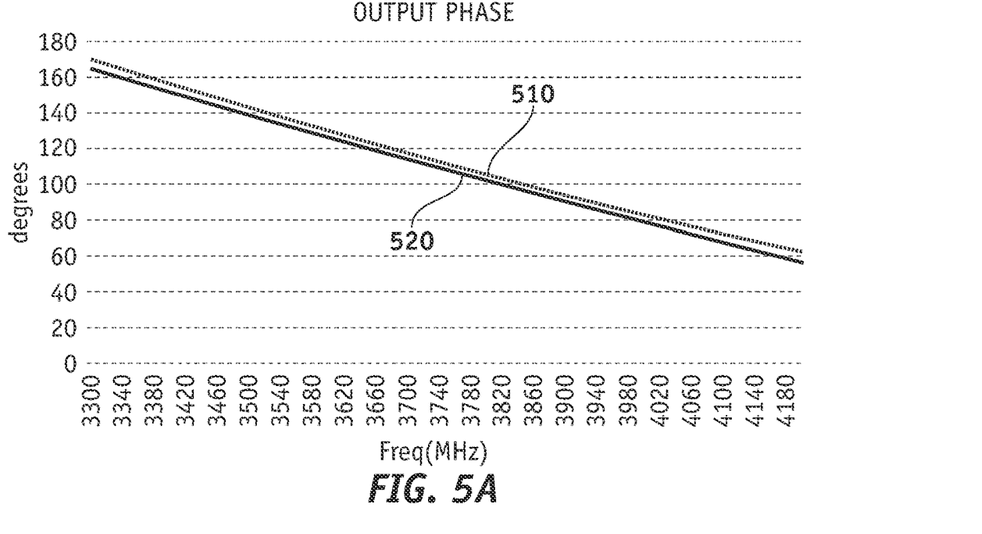
FIG. 5A shows the phase shifts (from input) of the high gain path and low gain path over a frequency range.
Figure 5B:
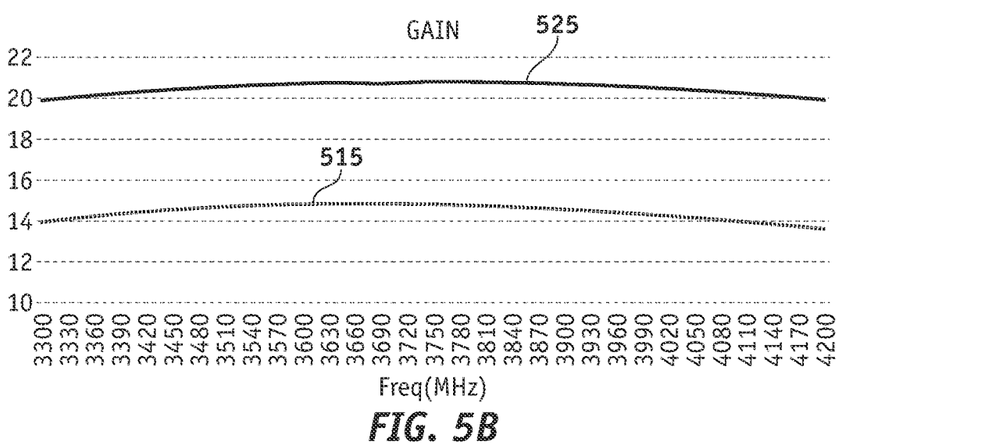
FIG. 5B shows the gains for the two gain paths.
Figure 5C:
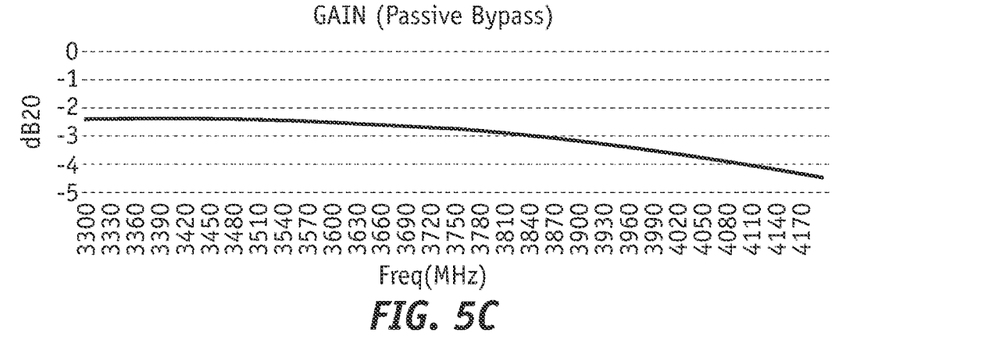
FIG. 5C shows the gain for the passive bypass.

FIG. 5A in an example graph showing that, using a phase shift sub-circuit (see e.g. FIG. 6C and FIG. 6D), the phases of the low gain path (510) and high gain path (520) remain relatively close over the frequency range. FIG. 5B shows that the low gain path gain (515) has a lower gain as compared to the high gain path gain (525) over that same range (it remains a low gain path). FIG. 5C shows that the passive bypass path gain shows appropriate performance in passive bypass mode by re-using components in the phase shift sub-circuit (see e.g. FIG. 6A).

As stated herein, a circuit that typically has an active and a passive bypass can be simplified by adding, for example, a configurable phase correction sub-circuit centered around 180 degrees, to the passive bypass path. With the passive bypass corrected, the active bypass is no longer need and can be removed from the circuit. This allows the circuit to have a smaller footprint, reduced complexity (thus better high gain mode performance), lower cost, etc. Table 1 shows the differences between the different paths, with and without the phase shifting sub-circuit added.

TABLE 1

| Path | Signal Route | Linearity | Phase | IDD Current |
|---|---|---|---|---|
| Active Bypass | Through Amplifier | High | In-phase with other gain modes | Low |
| Passive Bypass (no sub-circuit) | Switches | Very High | Out-of-phase with other gain modes (e.g. 180 deg.) | Very Low |
| Passive Bypass w/sub-circuit | Switches | Very High | Very close to being in-phase with other gain modes | Very Low |

As shown in Table 1, the new output match/phase shifter architecture phase correction in bypass mode provides a very high linearity with high phase matching with the least IDD current (supply current) consumed.

Figure 6A:
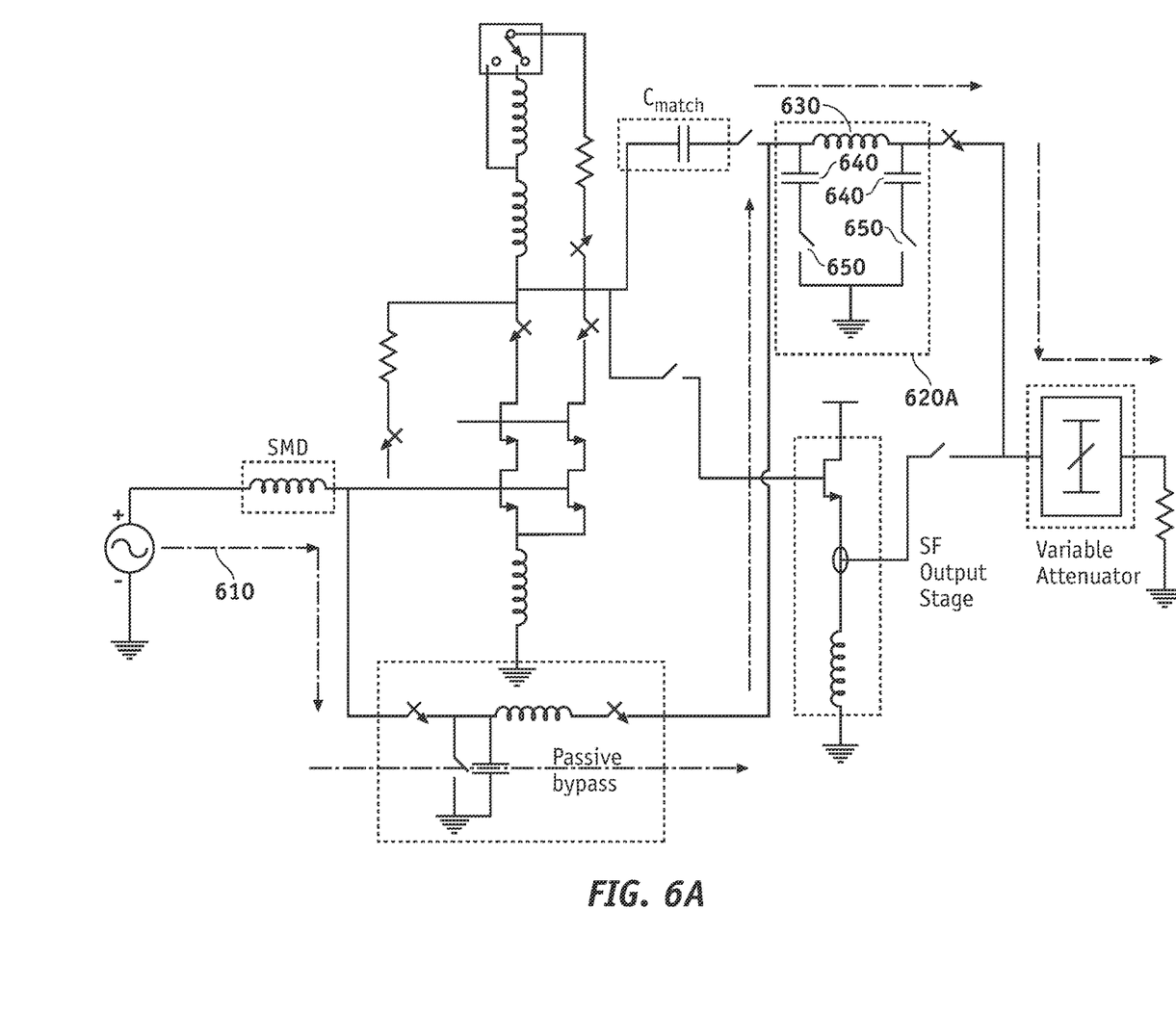
FIG. 6A shows the passive bypass mode.

FIG. 6A shows an example amplifier circuit with a passive bypass (610) path. Included in the path (610) is a phase matching sub-circuit (620A), in this case a low pass PI network topology with a negative phase shift. The sub-circuit (620A) utilizes an inductor (630) which also acts as an output matching element of the passive bypass (610). The capacitors (640) of the sub-circuit (620) are controlled by the switches (650). In the example here, the capacitors (640) are turned off (disconnected) by the switches (650) in passive bypass mode. In other words, only part of the sub-circuit is being used in this mode (for this example) and there is no phase shift for this passive bypass mode.

Figure 6B:
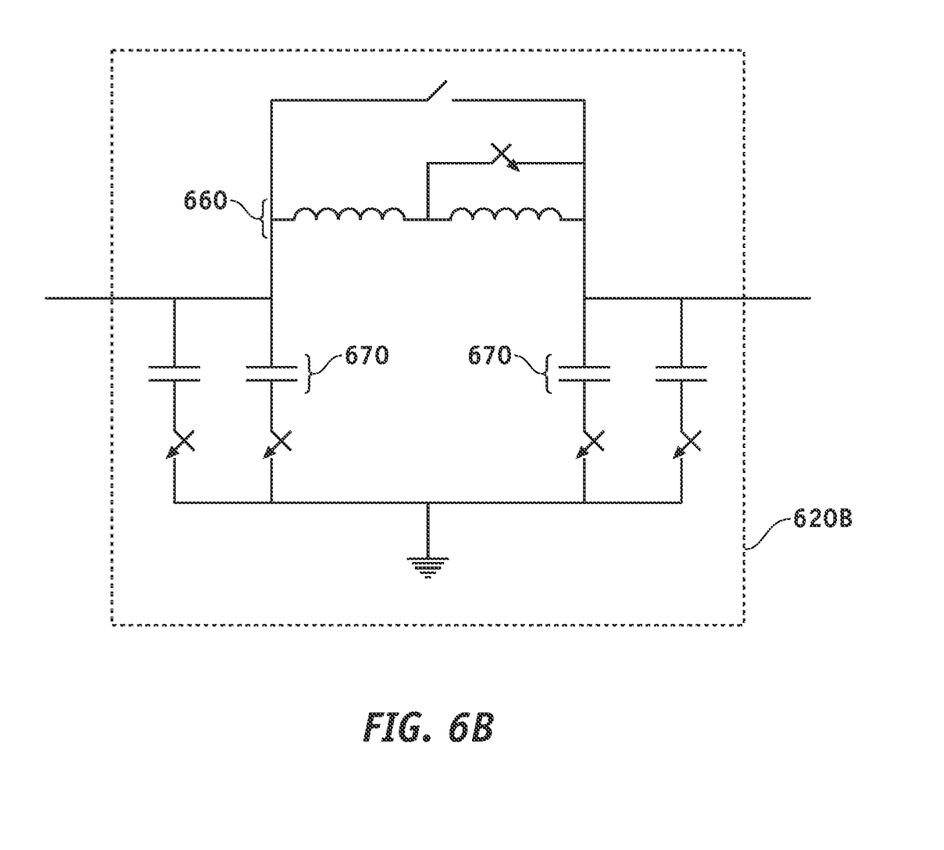
FIG. 6B shows an example alternative sub-circuit for the amplifier.

FIG. 6B shows another embodiment of a sub-circuit (620B) that can be implemented in place of the FIG. 6A sub-circuit (620A). In the example shown the inductors (660) and capacitors (670) can be independently controlled. This example shows two inductors (660) and four capacitors (670), but other embodiments with different numbers of elements can also be used (ex. three inductors and six capacitors).

In some embodiments the ratio of inductors to capacitors is kept at a fixed ratio (e.g. 1:2) when scaling in order to modify the phase value while keeping the impedance constant (e.g. 50 Ohms).

Figure 6C:
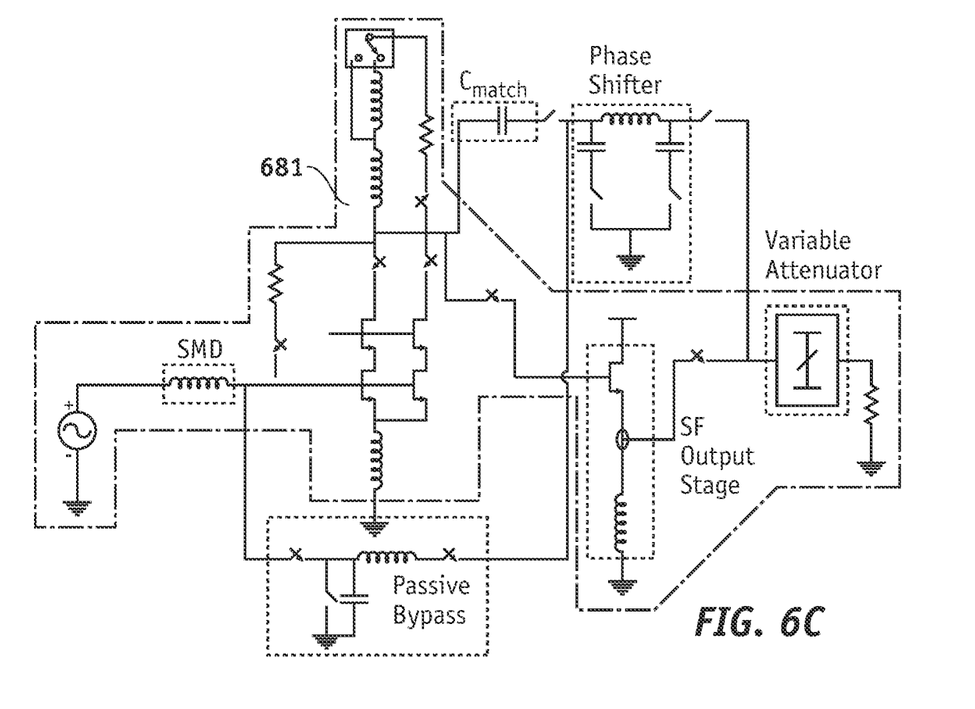
FIG. 6C shows the high gain mode.
Figure 6D:
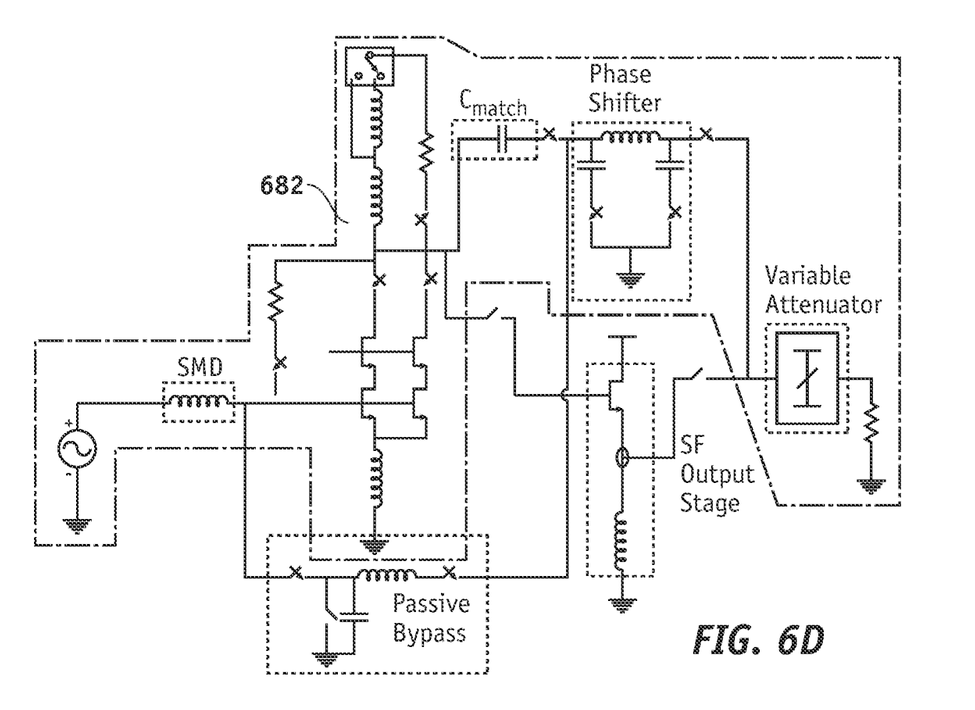
FIG. 6D shows the low gain mode.

FIG. 6C shows the circuit of FIG. 6A in high gain mode, the gain path (681) shown in broken dashed lines. It uses a source follower for high gain and a wide frequency band. FIG. 6D shows the circuit of FIG. 6A in low gain mode, the gain path (682) shown in broken dashed lines. The sub-circuit is fully utilized (all elements "on") for phase correction (phase is shifted), unlike in passive bypass mode (see FIG. 6A).

Figure 7:
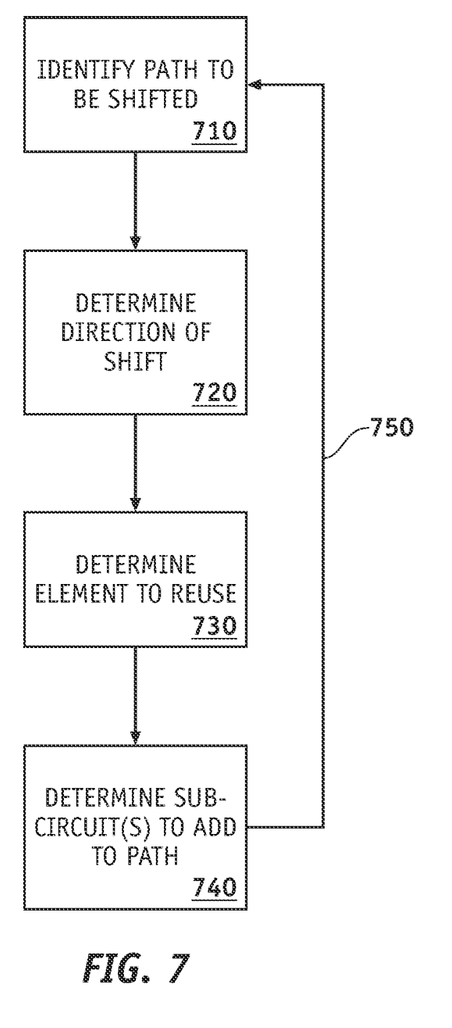
FIG. 7 shows an example flowchart for implementing the combined output matching and phase shift sub-circuit into a circuit.

FIG. 7 shows an example method to add a combined output matching and phase shifting sub-circuit. First, identify one of the gain paths to be phase shifted (710). This can be arbitrary, but specific design constraints may guide the choice. For example, if there are both active and passive bypass paths in the circuit, then phase shifting the passive bypass can allow for removing the active bypass path. Then the direction of the phase shift is determined (720). This can be dictated by the phases of the other paths, either shifting the current path's phase to align to another path, or a pre-determined phase shift based on a pre-determined alignment of all gain/bypass paths. An element in the current gain path is selected to be used in the sub-circuit (730). This can be arbitrary or directed based on the bandwidth requirements of the gain path. Given the phase shift and element selection, an appropriate sub-circuit (or block of sub-circuits) is determined (740) to be added to the gain path. In some embodiments, this is repeated (750) for other gain paths until the desired phase alignment among paths is complete. In some embodiments, the order of the steps is changed: for example, determining the element to reuse (730) can come before determining the direction of the shift (720), or the sub-circuit selection (740) can come before determining the element to reuse (730).

Figure 8A:
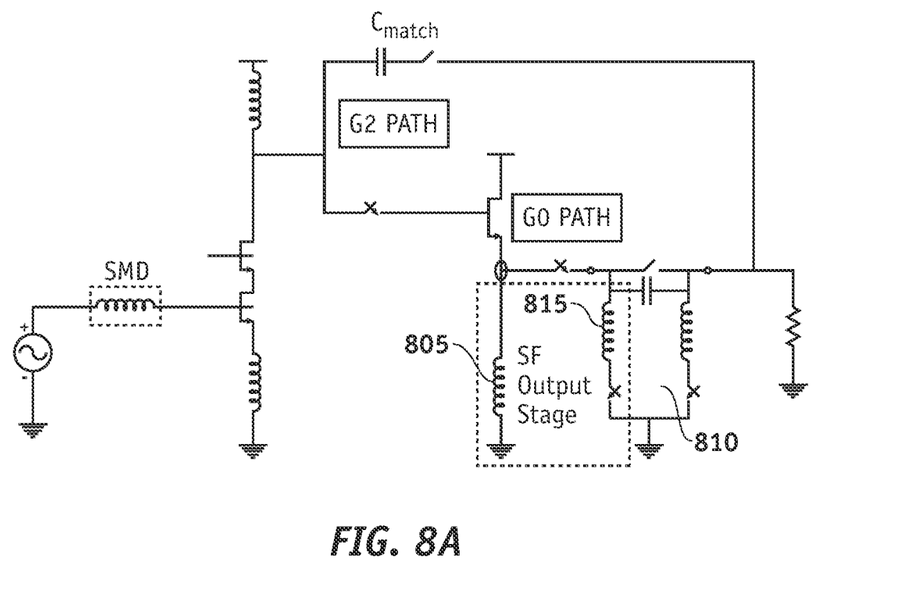
FIGS. 8A and 8B show an example of combining output matching and phase shift sub-circuit elements to reduce the number of elements needed to implement an amplifier.
Figure 8B:
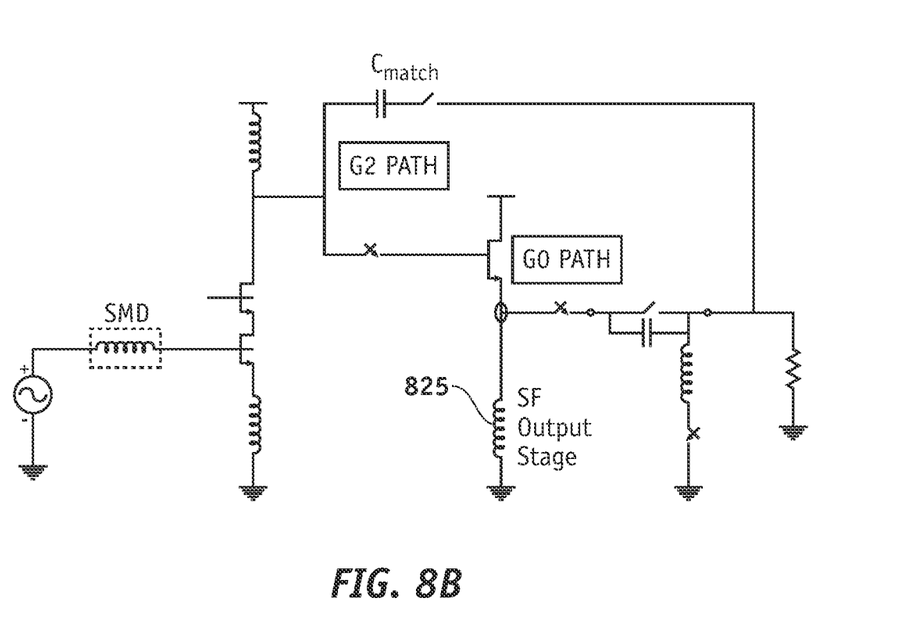

The combination of output matching and phase shifter sub-circuit elements is exemplified in FIGS. 8A and 8B. FIG. 8A shows an example design with an output matching inductor (805) at the SF output stage with a phase compensating sub-circuit (810) that includes an inductor (815) that, when on, would also contribute to the output matching. FIG. 8B shows a modified design from FIG. 8A where the SF output inductor (805) and the contributing sub-circuit inductor (815) are combined to a single inductor (825) that has equivalent inductance to the combination of the two original inductors in parallel (805, 815), thereby providing an equivalent circuit requiring one less element for its implementation.

A phase shift correction sub-circuit can be implemented using transmission lines. This is especially useful at millimeter-scale wavelength signals.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or or modules for ease of handling, manufacture, and/or improved performance. In particular, IC embodiments of this invention are often used in modules in which one or more of such ICs are combined with other circuit blocks (e.g., filters, passive components, and possibly additional ICs) into one package. The ICs and/or modules are then typically combined with other components, often on a printed circuit board, to form an end product such as a cellular telephone, laptop computer, or electronic tablet, or to form a higher level module which may be used in a wide variety of products, such as vehicles, test equipment, medical devices, etc. Through various configurations of modules and assemblies, such ICs typically enable a mode of communication, often wireless communication.

It is to be understood that the disclosure is not limited to particular methods or systems, which can, of course, vary. It is also to be understood that the terminology used herein is for the purpose of describing particular embodiments only and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A device comprising:
   a first gain path with a first gain and a first circuit component;
   a second gain path with a second gain different than the first gain and a second circuit component separate from the first circuit component;
   a phase shift sub-circuit on the second gain path wherein the phase shift sub-circuit includes the second circuit component and the second circuit component performs output matching for the device on the second gain path;
   wherein the second circuit component comprises an inductor; and
   wherein the first gain path comprises a first low noise amplifier with a first active device, or the second gain path comprises a second low noise amplifier with a second active device, or the first gain path comprises the first low noise amplifier with the first active device and the second gain path comprises the second low noise amplifier with the second active device.

2. The device of claim 1, wherein the second gain is lower than the first gain.

3. The device of claim 2, wherein the first gain path comprises the first low noise amplifier and the first low noise amplifier is a two-stage amplifier.

4. The device of claim 2, wherein the second gain path comprises the second low noise amplifier and the second low noise amplifier is a one-stage amplifier.

5. The device of claim 1, wherein the second gain is higher than the first gain.

6. A device comprising:
   a first gain path with a first gain and a first circuit component;
   a second gain path with a second gain different than the first gain and a second circuit component separate from the first circuit component;
   a phase shift sub-circuit on the second gain path wherein the phase shift sub-circuit includes the second circuit component and the second circuit component performs output matching for the device on the second gain path;
   wherein the first gain path comprises a first low noise amplifier with a first active device, or the second gain path comprises a second low noise amplifier with a second active device, or the first gain path comprises the first low noise amplifier with the first active device and the second gain path comprises the second low noise amplifier with the second active device;
   wherein the phase shift sub-circuit comprises one or more of a PI network or a TEE network; and
   wherein the phase shift sub-circuit further comprises switches configured to selectively switch elements of the PI network or TEE network on and off.

7. The device of claim 6, wherein the second circuit component comprises a capacitor.

8. The device of claim 6, wherein the second circuit component comprises an inductor.

9. The device of claim 1, wherein the first gain path comprises the first low noise amplifier and the second gain path comprises the second low noise amplifier.

10. The device of claim 1, wherein the phase shift sub-circuit comprises one or more of a PI network or a TEE network.

11. The device of claim 1, further comprising a second phase shift sub-circuit on the first gain path wherein the second phase shift sub-circuit includes the first circuit component and the first circuit component performs output matching for the device on the first gain path.

12. The device of claim 1, wherein the device is an amplifier.

13. The device of claim 1, wherein the phase shift sub-circuit is part of a cascode of phase shift sub-circuits.

14. The device of claim 1, wherein the phase shift sub-circuit is part of a block of parallel phase shift sub-circuits.

15. The device of claim 1, wherein the second gain path has two or more gain modes.

16. A method for adding a phase matching sub-circuit to a circuit with multiple gain paths, the method comprising:
   selecting a gain path of the multiple gain paths;
   determining a phase shift to match a phase of the gain path to phases of other gain paths of the multiple gain paths;
   determining a circuit component on the gain path to include in the phase matching sub-circuit;
   selecting a topology of the phase matching sub-circuit based on the phase shift and the circuit component;

including the phase matching sub-circuit to the circuit; and removing an active bypass from the circuit and wherein the gain path is a passive bypass.

17. The method of claim 16, further comprising repeating the method for a second gain path of the multiple gain paths.

18. The method of claim 16, wherein the topology is selected from TEE network and PI network topologies.

19. The method of claim 16, wherein the topology is selected from positive phase shift and negative phase shift topologies.

20. The method of claim 16, wherein the selecting a topology includes selecting a cascade of networks.

21. The method of claim 16, wherein the selecting a topology includes selecting a block of parallel networks.

22. The device of claim 10, further comprising a second phase shift sub-circuit on the first gain path wherein the second phase shift sub-circuit includes the first circuit component and the first circuit component performs output matching for the device on the first gain path.

* * * * *